United States Patent [19]

Kurtz et al.

[11] Patent Number: 4,482,794
[45] Date of Patent: Nov. 13, 1984

[54] PULSE-WIDTH CONTROL OF BONDING BALL FORMATION

[75] Inventors: John A. Kurtz; Donald E. Cousens, both of Saco; Mark D. Dufour, Portland, all of Me.

[73] Assignee: Fairchild Camera & Instrument Corporation, Mountain View, Calif.

[21] Appl. No.: 555,696

[22] Filed: Nov. 28, 1983

[51] Int. Cl.$^3$ .......................................... B23K 11/22
[52] U.S. Cl. ............................. 219/56.22; 219/56.21
[58] Field of Search ................. 219/56.1, 56.21, 56.22, 219/50, 56

[56] References Cited

U.S. PATENT DOCUMENTS 3,643,321 2/1972 Field et al.
4,098,447 7/1978 Edson et al.
4,323,759 4/1982 Edson et al.
4,390,771 6/1983 Kurtz et al.

Primary Examiner—C. C. Shaw
Attorney, Agent, or Firm—Kenneth Olsen; Carl L. Silverman; Daniel H. Kane, Jr.

[57] ABSTRACT

A method, timing control circuit, and power supply are described for initiating arc discharge between the cover gas delivery shroud and lead wire held in the bonding tool of a lead wire bonding machine for melting and forming a ball at the end of the lead wire. An arc discharge timing control pulse controls duration of the arc discharge within an empirically determined time window between the shortest and longest durations of arc discharge which result in optimal ball formation of a substantially spherical ball at the end of the lead wire without necking of the lead wire above the formed ball. The timing control circuit also provides an initial cover gas movement delay before ball formation for displacing oxygen from the shield and the end of the lead wire, and a subsequent cooling delay for solidifying and cooling the formed ball in the cover gas stream prior to ball bonding. The timing control pulses are applied to the ball bonding machine and are also coupled to the transistor electronic switch of a relatively high voltage power supply circuit for applying the arc discharge voltage through a resistance to the shield and lead wire when the electronic switch is conducting. Optical coupling is used between the low voltage timing control circuit and high voltage power supply circuit for electrically isolating the two voltage levels. The duration of arc discharge is controlled to fall within the critical time window between longest and shortest durations of arc discharge which result in optimal ball formation. Initially, the lead wire tail length extending below the bonding tool is selected to provide a ball of specified size; the voltage is selected according to tail length to form the mass of tail length metal into a substantially spherical ball; and a neck of desired thickness is selected by adjusting the duration of the arc discharge timing control pulse within the time window.

24 Claims, 10 Drawing Figures

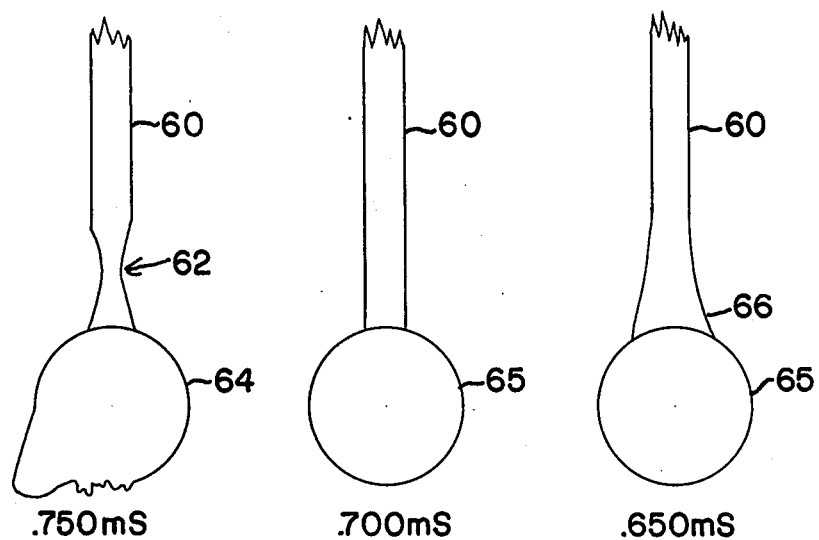
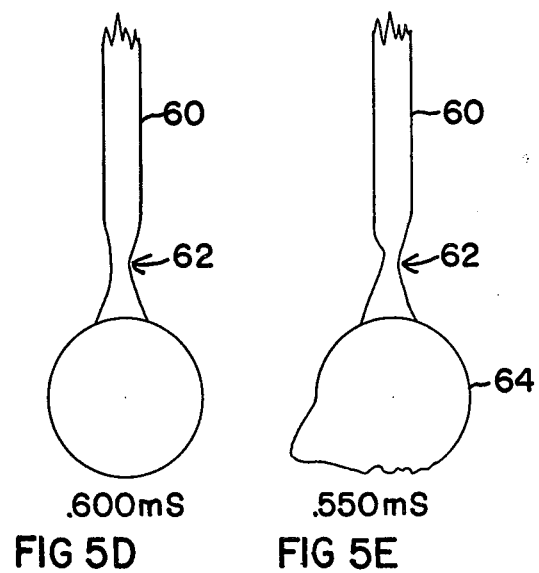

PULSE-WIDTH CONTROL OF BONDING BALL FORMATION

CROSS REFERENCE TO RELATED APPLICATIONS

This disclosure is related to U.S. patent application, Ser. No. 463,033, entitled CONTROLLED BONDING WIRE BALL FORMATION, filed Feb. 1, 1983 and U.S. patent application, Ser. No. 470,217, entitled LEAD WIRE BOND ATTEMPT DETECTION, filed Feb. 28, 1983. The two related applications were filed by the applicants of the present invention, assigned to the assignee of the present invention, and the disclosures of the respective related applications are incorporated herein by reference.

TECHNICAL FIELD

This invention relates to a new method and new control circuit and power supply for forming a ball at the end of bonding wire or lead wire held in the bonding tool of a lead wire bonding machine. Such ball formation has particular application for ball bonding of a fine lead wire to the die pad of an integrated circuit chip. The invention provides rapid and controlled delivery and precise timing for optimal ball formation of a substantially spherical ball at the end of a lead wire of, for example, aluminum or other metals, without "necking" or weakening of the lead wire above the formed ball.

BACKGROUND ART

Bonding of lead wires to a microcircuit chip or die mounted on a lead frame for coupling to external circuitry is generally accomplished by ball bonding. According to this technique, a fine lead wire or bonding wire is held in a capillary tool so that the lead wire projects beyond the end of the tool. The capillary tool forms part of a ball bonding machine in which the tool is appropriately mounted and positioned over the metalized die pad of an integrated circuit chip. Examples of such ball bonding machines include the Model 478, High Speed Tailless Thermocompression Ball Bonder, manufactured by Kulicke & Soffa Industries, Inc. (K&S), Horsham, Pa. 19044, described in U.S. Pat. No. 3,643,321; the K&S Model 1418/1419, Automatic High-Speed Wire Bonder with Digital Bonding Head; K&S Model 1482, Automatic Wire Bonder; and the ball bonding machines of The Welding Institute, Abington, England, described in U.S. Pat. Nos. 4,323,759 and 4,098,447.

A ball is formed at the end of the lead wire or bonding wire by, for example, arc discharge between the bonding wire and another electrode. A melted portion of the metal at the end of the lead wire forms a spherical ball under surface tension. After solidification, the metal ball at the end of the lead wire is brought into intimate contact with the metalized die pad and a bond is formed typically by thermocompression or ultrasonic bonding.

Prior art methods of ball formation for bonding lead wires generally suffer from lack of control over the ball formation process with consequent variation in the size, shape, overall strength and quality, and oxidation of the bonding ball. In particular, one of the problems associated with prior art methods of ball formation is the thinning and weakening of the lead wire which often occurs above the bonding ball. Such thinning and weakening of the lead wire at the stem adjacent to the ball is referred to as "necking" and presents the risk of failure or fracture of the lead wire at the ball bonding site. Further disadvantages of prior art ball bonding machines and methods are discussed in the "Background Art" section of U.S. Pat. No. 4,390,770 entitled "Bonding Wire Ball Forming Method and Apparatus", assigned to the assignee of the present invention.

According to the improved apparatus and method for bonding wire ball formation described in U.S. Pat. No. 4,390,771, a ball is formed at the end of bonding wire extending from a capillary tool by substantially enclosing the end of the bonding wire in a shroud or shield, flooding the shroud or shield and the end of the bonding wire with an inert gas, and generating a controlled electric arc discharge between the lead wire and the shroud or shield which function as complementary electrodes. According to the method disclosed, a controlled pulse train of electrical pulses is generated and delivered for arc discharge between the wire and shroud so that the quantity of energy delivered by the pulse train may precisely match the energy requirements for melting a ball of desired dimensions.

Applicants have found, however, that control over ball size and quality may be achieved while at the same time eliminating the problem of "necking" by delivering the ball formation energy with even greater rapidity in a shorter time and with improved timing control over the arc discharge energy in the context of the related cooperative operations of the ball bonding machine.

OBJECTS OF THE INVENTION

It is therefore an object of the present invention to provide more precise timing control over the delivery of arc discharge ball formation energy in ball bonding machines and within a shorter time period.

Another object of the invention is to provide a novel timing control circuit and power supply for bonding ball formation in manual, semi-automatic, and automatic ball bonding machines.

A further object is to provide a method for determining and utilizing the time window between the shortest and longest durations of arc discharge which result in optimal ball formation without "necking" or thinning of the lead wire above the ball.

DISCLOSURE OF THE INVENTION

In order to accomplish these results, the invention provides a relatively low voltage control circuit with a first timing element generating a first control pulse of first duration for controlling extension of the cover gas delivery shroud or shield on the bonding machine for delivery of cover gas through the shield throughout the first duration. A second timing element generates a second control pulse of second duration for introducing a cover gas movement delay before initiating ball formation thereby displacing oxygen from the shield and the end of the lead wire. A third timing element generates a third control pulse of third duration sequentially following the second control pulse for initiating arc discharge between the shield and lead wire. The duration of the third control pulse is adjusted for controlling the duration of arc discharge within an empirically determined time window between the shortest and longest durations of arc discharge which result in optimal ball formation of a substantially spherical ball at the end of the lead wire without necking of the lead wire above the formed ball. The fourth timing element generates a fourth control pulse of fourth duration sequentially following the third control pulse for introducing a cooling delay for cooling a ball formed at the end of the lead wire in the cover gas stream prior to ball bonding.

According to the invention, the timing elements which may be, for example, dual retriggerable, resettable multivibrators and flip flops are adjusted and arranged so that the first duration of the first control pulse is substantially the same as or greater than the composite durations of the sequential second, third, and fourth control pulses. Furthermore, the first control pulse is substantially coincident in time with the sequential second, third, and fourth control pulses.

The invention also provides a relatively high voltage power supply circuit which includes the cover gas delivery shield or shroud and the lead wire, a relatively high voltage source, resistance, and an electronic switch such as a transistor switch for applying the relatively high voltage source through the resistance to the shield and lead wire when the electronic switch is conducting and for cutting off the relatively high voltage source from the shield and lead wire when the electronic switch is non-conducting. Furthermore, the relatively low voltage timing control circuit is coupled to the relatively high voltage power supply circuit through a coupling element so that the third control pulse effectively controls the conducting state of the electronic switch.

In a preferred form of the invention the coupling element comprises an optical coupling thereby electrically isolating the relatively low voltage timing control circuit from the relatively high voltage power supply circuit. For example, the control circuit may include a light emitting diode for emitting an optical pulse corresponding to the third control pulse which is the arc discharge timing pulse. The power supply circuit is provided with an optical relay such as an optical transistor or phototransistor which controls the electronic switch.

In the preferred range of the invention a DC voltage in the range of, for example, 340 to 1,300 volts is applied to the shield and lead wire through a resistance in the range of, for example, 5 to 200 ohms for rapid delivery of the arc discharge ball forming energy. The lower limit of the range, 340 volts, is the lower voltage limit at which feasible arc discharge is established. According to the voltage and resistance selected, the invention contemplates empirically determining the longest and shortest duration of arc discharges which nevertheless result in optimal ball formation of spherical balls without necking and therefore empirically determining the time window between said longest and shortest durations of arc discharge. For example, applying a voltage in the range of 400 to 850 volts through a resistance of approximately 50 ohms using 1.25 mil aluminum lead wire, the range of duration of the arc discharge and therefore the arc discharge control pulse or third control pulse for optimal ball formation without necking is from approximately 0.65 to 0.70 milliseconds (mS).

While the absolute length of the shortest and longest duration of arc discharge for optimal ball formation may vary according to the high voltage and resistance selected, applicants have found that the time window between such shortest and longest durations for the arc discharge and arc discharge control pulse remains approximately 0.05 to 0.1 mS in width throughout the preferred range of selected values. Thus, the voltage and resistance values are selected so that the time window between the shortest and longest durations of arc discharge which result in optimal ball formation without necking is in the range of 0.05 to 0.1 mS.

Initially, the tail length of lead wire extending below the bonding tool is selected to provide the desired ball size and mass. Essentially the entire tail length forms the ball during ball formation. The voltage and therefore power or rate of energy delivery is then selected at a level within the specified range adequate to form the mass of tail length metal into a substantially perfect sphere. This will generally occur according to the invention within a time window in the range of 0.05 mS to 0.1 mS between the longest and shortest durations of arc discharge which result in optimal spherical ball formation without necking. Such time window may fall, for example, with preferred parameters between arc durations of approximately 0.65 and 0.70 milliseconds.

The duration of arc discharge is then selected within the time window according to the invention to provide a neck of desired thickness for supporting the spherical ball. A straight neck is formed at the longer duration time pulse end or boundary of the time window and a thickened or reinforced neck is formed at the shorter duration time pulse end or boundary of the time window. The window is therefore also defined as the range of duration of arc discharge time pulses within which the longest time pulse still produces a straight neck above a spherical ball and within which the shortest time pulse produces a reinforced neck above a spherical ball.

The invention therefore contemplates selecting a lead wire tail length extending below the bonding tool to give a ball of desired size, selecting a voltage within the specified range to form a substantially perfect sphere of the tail length mass of metal, and selecting the duration of arc discharge and third time pulse within the time window to provide a desired neck thickness. A feature and advantage of the invention is that it can actually provide a substantially perfect sphere supported by a thickened or reinforced neck, a structure never achieved before as far as applicants are aware.

The invention contemplates both the apparatus and method for controlled bonding ball formation by operating the novel timing control circuit and power supply and operating the ball bonding machine according to the foregoing principles. The invention may be implemented by retrofitting existing ball bonding machines such as those identified in the background discussion and in new self contained ball bonding machines.

BRIEF DESCRIPTION OF THE DRAWINGS

FIG. 5 is a diagrammatic view of bonding balls formed in accordance with the invention at successive durations of arc discharge for empirically determining the time window between the shortest and longest durations of arc discharge which result in optimal ball formation of spherical bonding balls without necking of the lead wire and further illustrating the preferred time window range.

DESCRIPTION OF PREFERRED EXAMPLE EMBODIMENTS AND BEST MODE OF THE INVENTION

Figure 1:
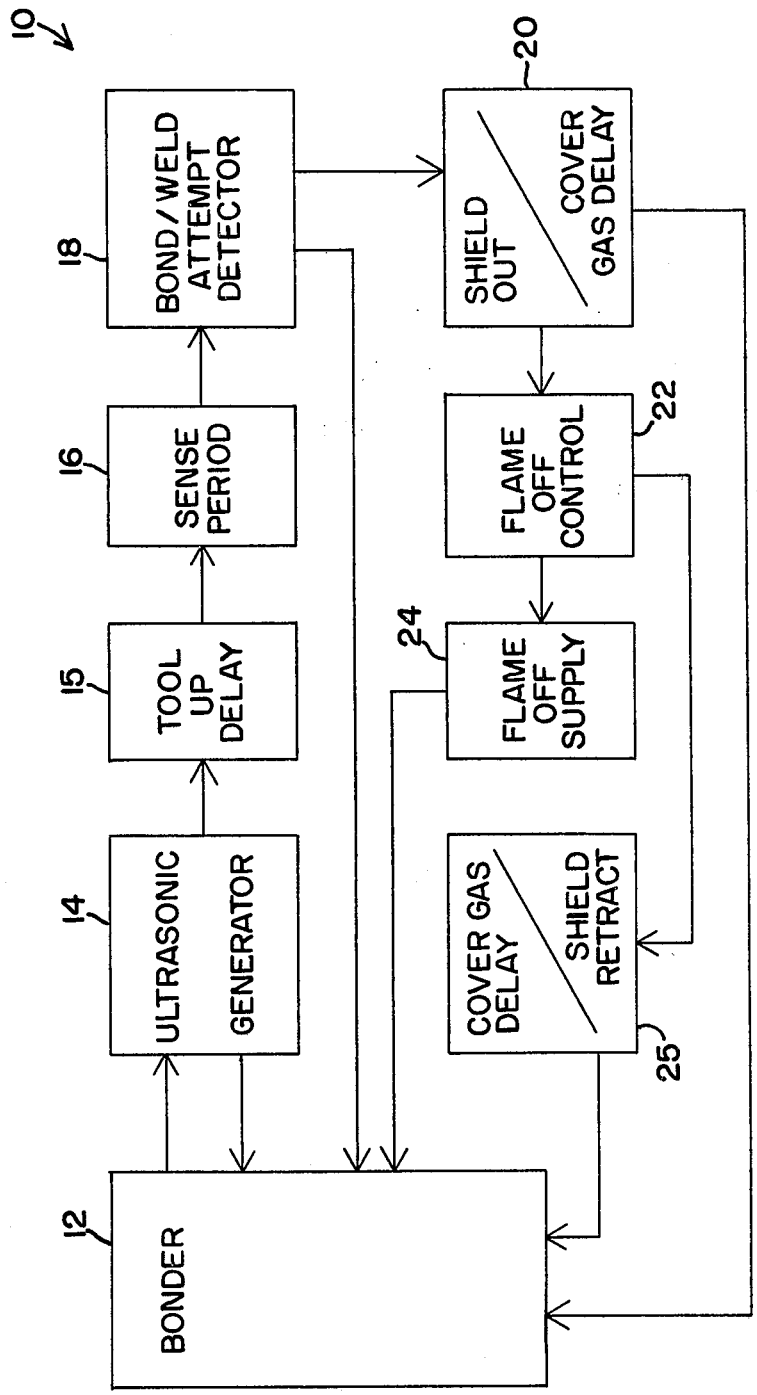
FIG. 1 is a block diagram of the apparatus and method for controlled bonding ball formation according to the invention in the larger system context of an automatic ball bonding machine.

FIG. 1 is a block diagram of a ball bonding machine system 10 of the type, for example, described in the related patent applications cross referenced at the beginning of this disclosure. The system 10 includes a basic ball bonder or ball bonding machine 12 of the type, for example, identified in the background discussion above. The bonder 12 effects ball bonding of lead wire to the die pad of an integrated circuit chip or wedge bonding of the lead wire to a lead frame finger by application of ultrasonic energy at the capillary bonding tool derived from an ultrasonic generator 14. As described in applicant's U.S. patent application, Ser. No. 470,217, following a ball bond or a wedge bond, a system delay is implemented by logic circuitry 15 while the bonding tool is raised above the bonding site. This is followed by a controlled sense period or duration implemented by further logic circuitry 16 during which a bond/weld attempt detector 18 senses and detects whether or not there has been a failure of a ball bond or wedge bond. Further detailed description of this particular system context of the embodiment of FIG. 1 may be found in U.S. patent application, Ser. No. 470,217, with reference to FIGS. 12 and 12A of that patent application. While the invention is here described with reference to such an example embodiment, it is apparent that the invention may be implemented in or retrofitted with reference to any particular ball bonding machine and system context.

The subject matter of the present invention relates to the four lower blocks of the diagram of FIG. 1 which may be viewed in part as a flow chart, namely the shield out/cover gas delay timing elements or steps 20, the flame off control or arc discharge control timing element or step 22, the flame off supply or high voltage arc discharge power supply 24, and the cover gas delay/shield retract timing elements or steps 25. It is noted that the phrase "flame off" is a term of art referring to the application of energy of whatever type for ball formation at the end of a lead wire. In the present context, ball formation is accomplished by controlled arc discharge while according to earlier stages in ball bonding technology, gas flame was also used accounting for the relict terminology. The lower portion of the block diagram of FIG. 1 is hereafter elucidated with reference to the subsequent figures.

Figure 2:
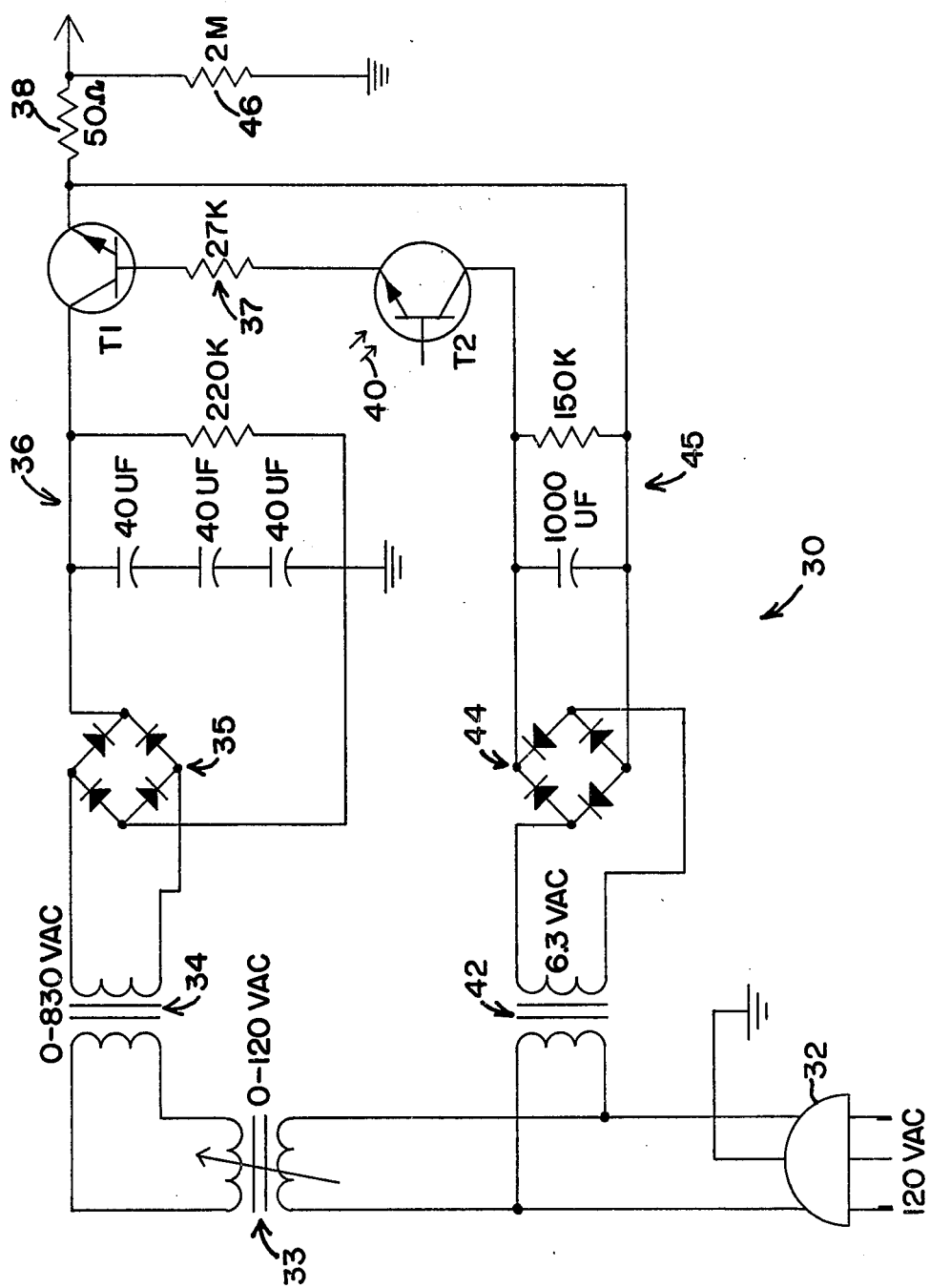
FIG. 2 is a detailed schematic diagram of the power supply according to the invention shown in the block diagram of FIG. 1.

The high voltage power supply 30 of FIG. 2 is derived from the line voltage 32. From the line voltage a high level DC voltage is derived through variac 33, step up transformer 34, and full wave rectifying bridge 35. Variation of the AC line voltage through variac 33 controls the level of AC voltage at the secondary of transformer 34 up to the range of, for example, 830 to 850 volts peak to peak AC. The effective RMS DC voltage from the output of full wave rectifying bridge 35 may therefore be varied up to, for example, 1,200 to 1,300 volts DC. The filter 36 rounds off spikes and smoothes the rectified DC voltage.

Transistor T1 is a high voltage gate transistor which functions in the high voltage power supply 30 as an electronic switch for controlling application of the relatively high DC voltage to the arc discharge circuit including the cover gas delivery shield or shroud and lead wire. When the transistor electronic switch T1 is conducting the positive polarity rectified and filter DC voltage is applied through resistor 38 to the cover gas delivery shroud or shield not shown. The cover gas delivery shield is of the type, for example, illustrated in FIGS. 4 and 5 of U.S. Pat. No. 4,390,771.

A feature and advantage of establishing the positive polarity at the shroud and the negative polarity or cathode at the lead wire is that the sharp end of the lead wire permits more rapid breakdown and ionization of the air or cover gas between the lead wire and shroud. Arc discharge can therefore be established more rapidly and with greater control. Furthermore, establishing the negative polarity or cathode at the smaller volume of the lead wire heats the wire quickly for more rapid ball formation.

In the example of FIG. 2, the resistance 38 through which the relatively high DC voltage is applied is, for example, 50 ohms. The resistance of resistor 38, however, may be selected over a range of, for example, 5 to 2,000 ohms but preferably in the lower range of, for example, 5 to 200 ohms for more rapid initiation of arc discharge and more rapid delivery of energy. The value of resistor 38 may vary according to the voltage selected at the output of full wave bridge 35. This may be varied over the range of, for example, 340 to 1,300 volts DC and in the examples hereafter described is selected to be in the range of 400 to 850 volts DC. The criteria for matching the selected voltage and resistor 38 are further described with reference to FIG. 5.

These criteria include selecting a lead wire tail length extending below the bonding tool to give a ball of desired mass and size; selecting a voltage within the specified range adequate to form up the tail length metal into a substantially spherical ball; and selecting the duration of arc discharge within the time window according to the invention to provide the desired neck thickness.

The conducting state of transistor electronic switch T1 is controlled in turn by the conducting state of the phototransistor T2 whose collector to emitter circuit is connected through resistor 37 to the base of transistor T1. The phototransistor or optically responsive transistor T2 responds to a light pulse 40 delivered by the timing control circuit of FIG. 3 as hereafter described. The light pulse 40 corresponds to a low level voltage control pulse to initiate arc discharge by switching transistor T1 to the conducting state and controlling the duration of arc discharge by controlling the duration of the conducting state of transistor T1. The low level voltage power supply controlled by phototransistor T2 for driving the base of transistor T1 is derived from the line voltage 32 through a step down transformer 42 and a second low voltage full wave rectifying bridge 44. The low level DC voltage, for example, 8 to 9 volts DC at the output of full wave bridge 44 is filtered by filter elements 45 and connected to the collector to emitter circuit of phototransistor T2 which controls application of the low level voltage for base drive at the base to emitter circuit of transistor T1. The 2 megohm (M) resistor 46 drains off any leakage current across the high voltage transistor T1.

Figure 3:
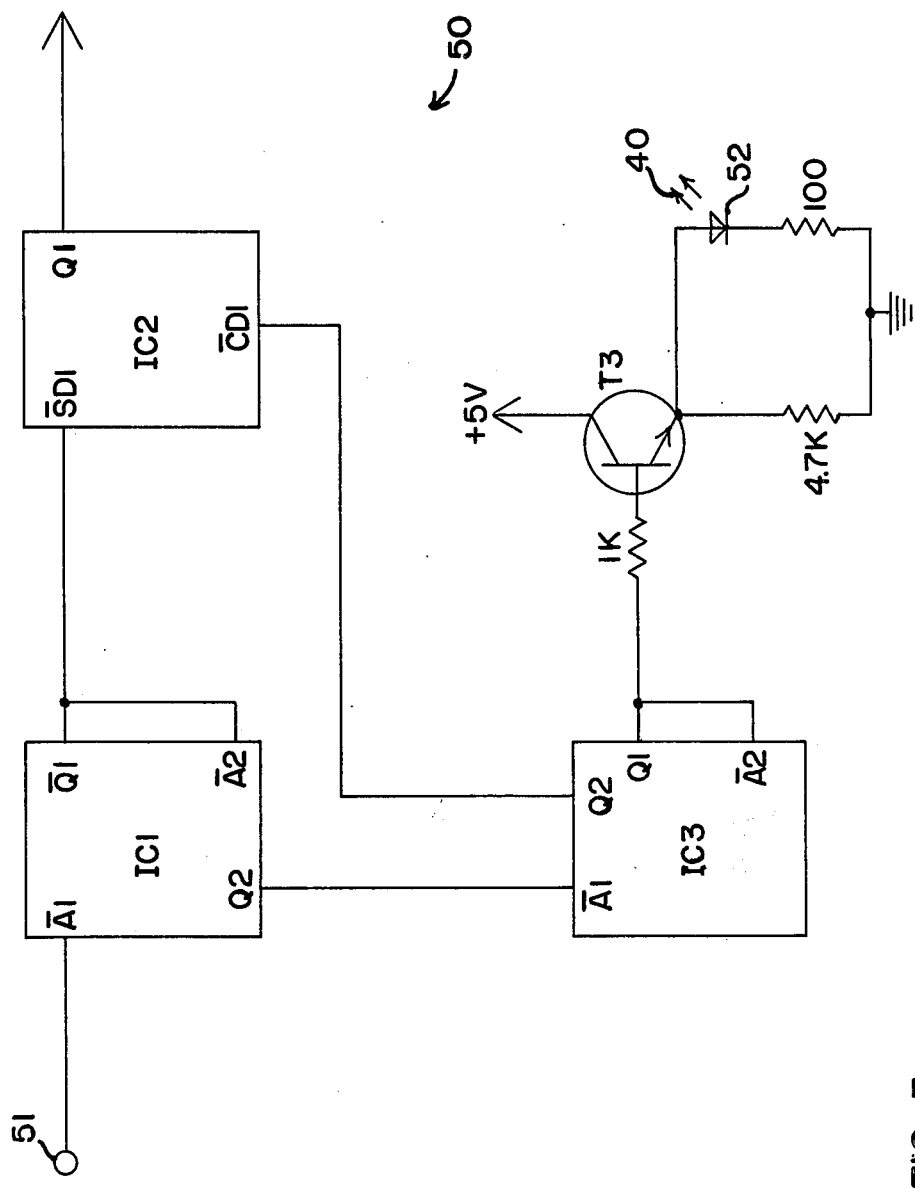
FIG. 3 is a detailed schematic diagram of the timing control circuit according to the invention.

The timing control circuit 50 for timed and coordinated control of the power supply of the FIG. 2 with elements of the ball bonding machine hereafter described is illustrated in FIG. 3. Blocks IC1 and IC3 are dual retriggerable, resettable multivibrators such as, for example, generic designation number 74123 integrated circuits while block IC2 is a flip flop such as a generic designation number 7476 integrated circuit. Operation of the timing control circuit 50 and the following description may be better understood with reference to the timing diagram of FIG. 4. The signal derived from the ball bonding machine to initiate ball formation is applied at terminal 51 to the input A1 of the first half or first multivibrator of IC1. The signal at terminal 51 in the context of the system embodiment of FIG. 1 may also be derived from the bond/slash weld attempt detector 18 indicating completion of a bond weld cycle and preparation for a new bond weld cycle by ball formation at the end of the lead wire.

When the ball forming signal appears at terminal 51 and input $\overline{A1}$ of IC1, output $\overline{Q1}$ goes low and sets the latch $\overline{SD1}$ of flip flop IC2. The output Q1 of IC2 therefore goes high providing the high level output signal which actuates the extension of the cover gas delivery shield or shroud to extended position at the end of the lead wire and the delivery of cover gas through the shield to the end of the lead wire. Flip flop IC2, which is set by the $\overline{Q1}$ output of IC1, may therefore be viewed as a first timing element generating a first control pulse of first duration which controls the extension of the shield and delivery of cover gas throughout the first duration of the first control pulse.

The first output $\overline{Q1}$ of IC1 is also coupled to the input $\overline{A2}$ of the second half or second multivibrator of IC1. When $\overline{Q1}$ goes low, $\overline{A2}$ is set and the second output Q2 of IC1 also goes high generating an output pulse which establishes a cover gas movement delay during a period of, for example, 3 milliseconds (mS) for clearing air and oxygen from the shield and from the vicinity of the end of the lead wire. The second half or second multivibrator of IC1, which is set by the $\overline{Q1}$ output of IC1, may therefore be viewed as a second timing element generating a second control pulse of second duration for controlling the cover gas movement delay. It should be noted that the "shieldout" first timing control pulse at the Q1 output of IC2 and the cover gas movement delay timing control pulse at the Q2 output of IC1 are initiated at the same time.

When the cover gas delay timing control pulse at the Q2 output of IC1 goes low, the input $\overline{A1}$ of the first half or first multivibrator of IC3 is triggered so that the Q1 output of the first half of IC3 goes high initiating a third timing control pulse or arc discharge control pulse for controlling the duration of arc discharge between the shield and lead wire. The first half or first multivibrator of IC3 therefore serves as a third timing element generating a third timing control signal for controlling the duration of arc discharge. The parameters of IC3 are adjusted as hereafter described with reference to FIG. 3A so that Q1 remains high for a pulse duration which terminates within the time window between the shortest and longest periods for arc duration which result in optimal ball formation of a spherical ball without necking. For the parameters selected, for example, with reference to the examples of FIG. 2 thru 5, the Q1 output of IC3 may be set to remain high for a duration of, for example, 0.65 mS to 0.70 mS. During the pulse period while the Q1 output of IC3 remains high, amplifying transistor T3 becomes conducting delivering a current through light emitting diode 52. LED 52 emits an optical pulse 40 of duration corresponding to the pulse duration of the third control pulse or arc discharge control pulse at the Q1 output of IC3. The optical pulse 40 is received by phototransistor T2 in the high voltage power supply of FIG. 2 for controlling the conducting state of transistor electronic switch T1 thereby initiating and controlling the duration of arc discharge between the shield and lead wire for optimal ball formation.

When the Q1 output of IC3 goes negative, the arc discharge ceases. Furthermore, the Q1 output of IC3 is tied to the $\overline{A2}$ input of the second half or second multivibrator of IC3. Thus, when IC3 Q1 goes negative or goes low, IC3 $\overline{A2}$ is triggered and the output Q2 of the second half of IC3 goes high generating a fourth timing control pulse for initiating and controlling the cooling delay. IC3 is adjusted so that the Q2 output pulse has a duration of, for example, 3 mS for cooling of a ball melted and formed at the end of the lead wire prior to subsequent ball bonding. Thus, the second half or second multivibrator IC3 may be viewed as a fourth timing element generating a fourth timing control pulse of fourth duration. When the fourth timing control pulse at IC3 Q2 goes low, it triggers $\overline{CD1}$ of flip flop IC2 and clears the flip flop. The first timing control signal at IC2 Q1 therefore goes low. The cover gas delivery shield retracts and delivery of cover gas ceases.

Figure 4:
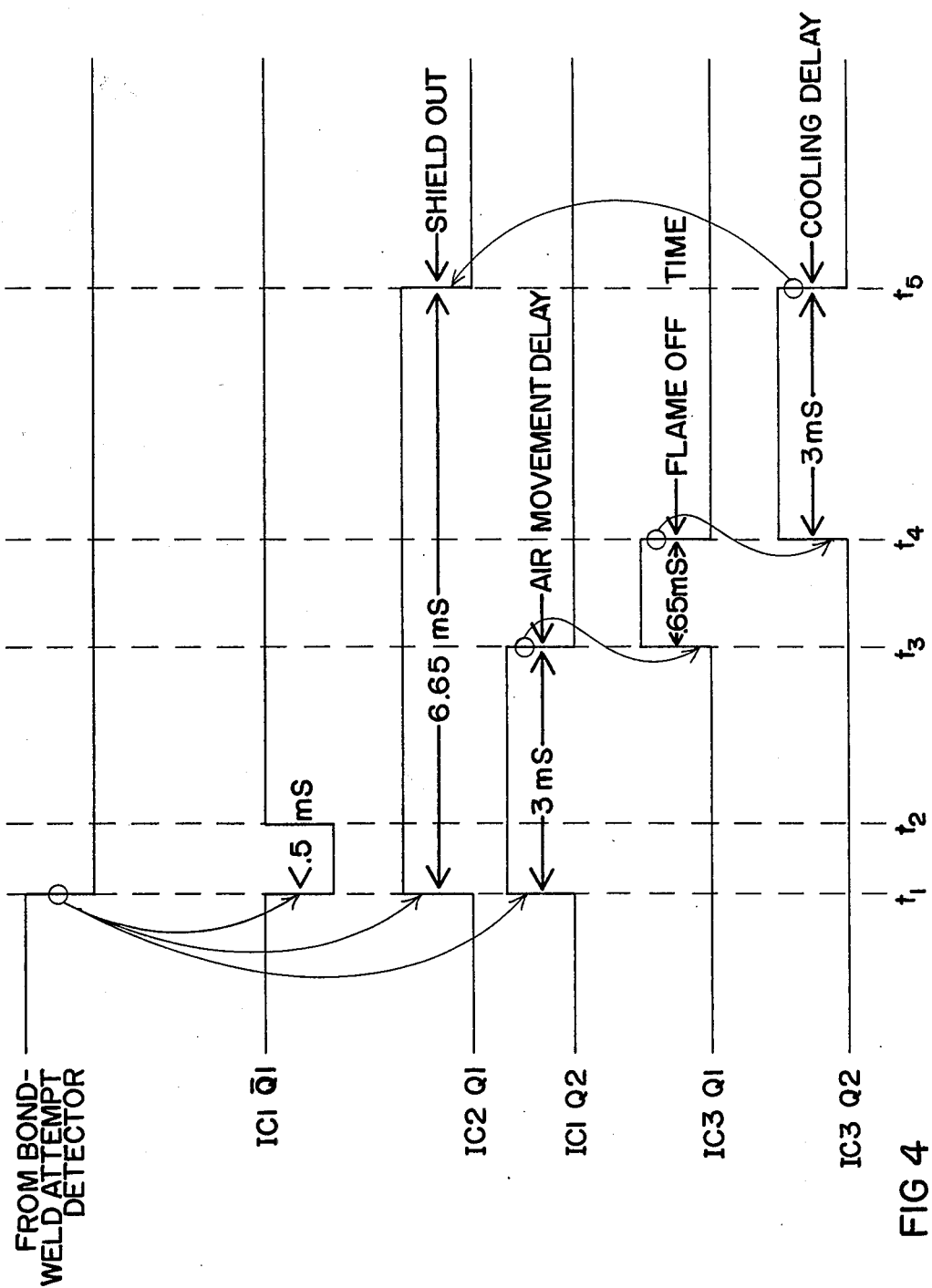
FIG. 4 is a timing diagram illustrating operation of the timing control circuit of FIG. 3.

A number of features of the invention may be noted with reference to FIGS. 3 and 4. The second, third, and fourth timing control pulses are actuated sequentially following each other in serial fashion. The sequence of the sequential second, third, and fourth control pulses is initiated at the same time as the first control pulse appearing at IC2 Q1. The pulse sequence of the second, third, and fourth control pulses also terminates at the same time as the first control pulse at IC2 Q1. In terms of the physical steps implemented by the method of the present invention, the "shieldout" first control pulse which controls the duration of extension of the shield and delivery of cover gas has a period or duration equal to the composite periods or durations of the sequential second, third, and fourth control pulses and in fact the first control pulse is substantially coincident with the three sequential pulses.

Figure 3A:
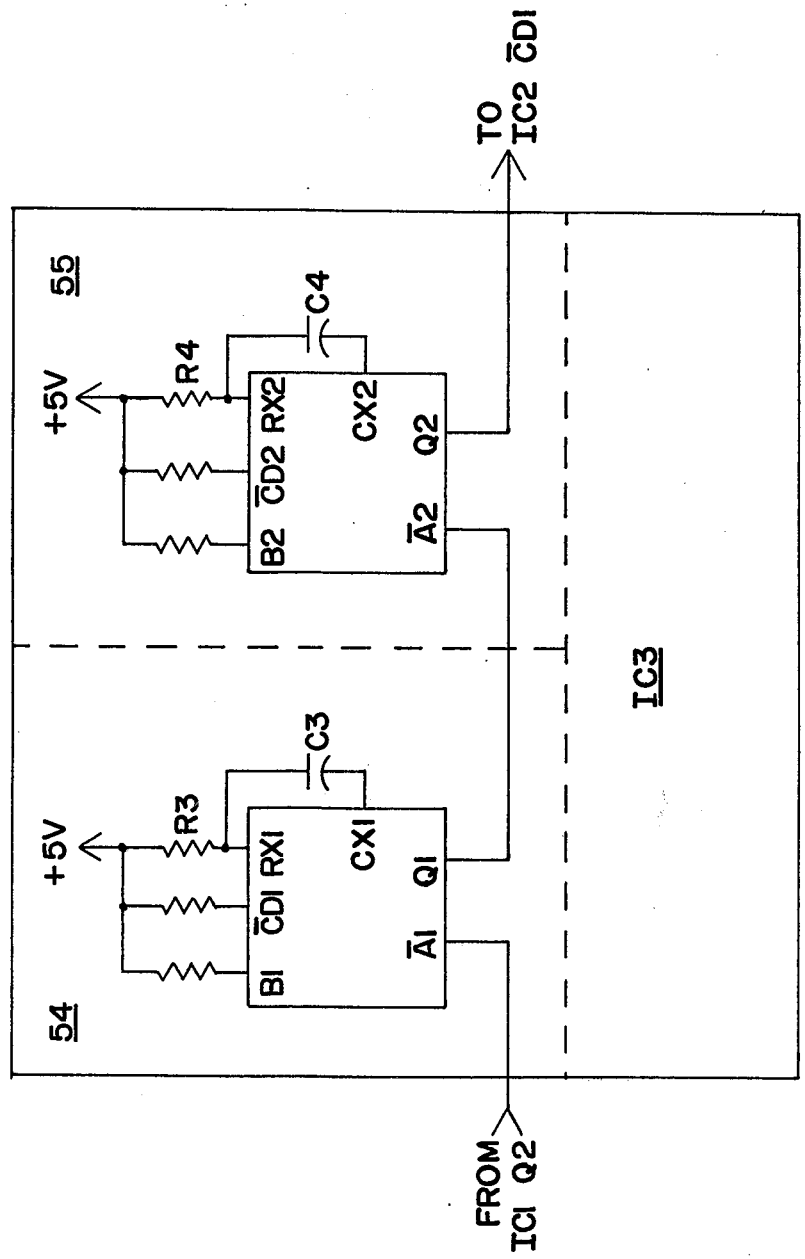
FIG. 3A is a further detailed schematic diagram of one of the dual retriggerable, resettable multivibrators incorporated into the timing control circuit of FIG. 3.

To illustrate the setting, adjustment and control of the pulse duration of the timing control pulses, one of the dual retriggerable, resettable multivibrators IC3 is shown in further detail in FIG. 3A. As shown in FIG. 3A, the dual multivibrator IC3 is divided into a first half or first multivibrator 54 and a second half or second multivibrator 55. The first half 54 constitutes the third timing element generating the third control pulse or arc discharge control pulse at the output IC3 Q1. The duration of this arc discharge control pulse is adjusted and set by the selection of the parameters of resistor R3 and capacitor C3 so that the pulse duration falls within the critical time window between the longest and shortest duration of arc discharge which results in optimal ball formation of a spherical ball without necking. In the examples here described and for the parameters selected, for example, in FIGS. 2 and 3, the pulse duration of the third control pulse or arc discharge control pulse is set substantially within the critical range of approximately 0.65 to 0.70 mS, that is, falling within the optimum time window having a width of 0.05 to 0.1 mS between the longest and shortest durations of arc discharge for optimal ball formation.

The second half 55 of IC3 effectively forms the fourth timing element generating the fourth control pulse or cooling delay control pulse at the output IC3 Q2. The duration of the cooling delay control pulse is adjusted by the selection of the parameters for resistor R4 and capacitor C4.

The results of ball formation with the power supply and control circuit of FIGS. 2 and 3 and according to the method of the present invention are illustrated in FIGS. 5A through 5E. For bonding of 1.25 mil aluminum lead wire, parameters were selected of high voltage for arc discharge in the range of 400 to 850 volts through a resistance of 50 ohms. Outside the optimum time window in the order of 0.05 to 0.1 mS in width extending slightly on either side of the arc discharge durations of 0.650 mS and 0.700 mS, necking or weakening of the lead wire 60 occurs. Such necking or weakening 62 is illustrated, for example, in FIGS. 5A, 5D, and 5E. Furthermore, optimum ball formation size, shape, and quality fall off on either side of the optimal time window as shown by the irregular balls 64 shown in FIGS. 5A and 5E in contrast with the optimal balls 65 of spherical shape illustrated in FIGS. 5B and 5C. As shown in FIG. 5C, the neck or stem 66 adjacent to ball 65 is actually thickened and reinforced at the shorter time duration end or boundary of the optimal time window. As shown in FIG. 5B, the neck or stem of lead wire 60 adjacent spherical ball 65 remains straight at the longer pulse duration end or boundary of the time window. Because of the apparent sharpness of the ball forming window of optimality, the shortest and longest durations of arc discharge, and the arc discharge control pulse or third control pulse, which result in optimal ball formation should be accurately empirically determined for each selection of circuit parameters but will generally define a time window in the range of 0.05 mS to 0.1 mS between the longest and shortest pulses with the time window of optimal ball formation.

Thus, the present invention contemplates the steps of selecting the tail length of lead wire extending below the bonding tool to provide the desired ball size and mass; selecting voltage at a level within the specified range adequate to form the mass of tail length metal into a well formed sphere; and empirically determining the longest and shortest durations of arc discharge which result in optimal ball formation of a spherical ball without necking and the time window of ball forming optimality between such longest and shortest time pulse durations. Applicants have noted that throughout the preferred range of selected parameters, the width of the ball forming window of optimality, that is the time window between the shortest and longest durations of arc discharge which result in optimal ball formation remains substantially the same in the order of 0.05 to 0.1 mS. The duration of the third timing control pulse or arc discharge control pulse according to the present invention is then adjusted to fall within the time window of ball forming optimality in order to provide a neck of desired thickness.

While the invention has been described with reference to particular example embodiments, it is intended to cover all variations and equivalents within the scope of the present invention.

We claim:

1. Apparatus for controlled bonding ball formation at the end of a lead wire held in the bonding tool of a lead wire bonding machine, by arc discharge between the extendable and retractable cover gas delivery shield of the bonding machine and the lead wire, said arc discharge thereby melting and forming a ball at the end of the lead wire for ball bonding to the die pad of an integrated circuit chip, comprising:

relatively low voltage control circuit means comprising first timing means generating a first control pulse of first duration for controlling extension of the shield and delivery of cover gas through said shield throughout said first duration, second timing means generating a second control pulse of second duration for introducing a cover gas movement delay before ball formation for displacing oxygen from the cover gas shield and the end of the lead wire, third timing means generating a third control pulse of third duration sequentially following the second control pulse for initiating arc discharge between the shield and lead wire, said third timing means and the duration of said third control pulse being arranged and selected for controlling the duration of said arc discharge within an empirically determined time window between the shortest and longest durations of arc discharge which result in optimal formation of a substantially spherical ball at the end of the lead wire without necking of the lead wire above the formed ball, fourth timing means generating a fourth control pulse of fourth duration sequentially following the third control pulse for introducing a cooling delay for cooling a ball formed at the end of the lead wire with cover gas prior to ball bonding, said plurality of timing means constructed and arranged so that the first duration of the first control pulse is substantially the same as or greater than the composite durations of the sequential second, third, and fourth control pulses and so that the first control pulse is substantially coincident in time with said sequential second, third and fourth control pulses:

relatively high voltage power supply circuit means comprising the shield and lead wire, a relatively high voltage source, resistance means, and electronic switching means for applying the relatively high voltage source through said resistance means to the shield and lead wire when said electronic switching means is conducting and for cutting off said relatively high voltage source from the shield and lead wire when said electronic switching means is nonconducting:

first coupling means for coupling the relatively low voltage control circuit means and relatively high voltage power supply circuit means so that the third timing means and third control pulse effectively control the conducting state of said electronic switching means;

and second coupling means for coupling the relatively low voltage control circuit means and a lead wire bonding machine for receiving signals from the bonding machine to initiate controlled bonding ball formation and for providing signals to the bonding machine to control the cover gas delivery shield 2. The apparatus of claim 1 wherein said first coupling means comprises optical coupling means thereby electrically isolating the relatively low voltage control circuit means from the relatively high voltage power supply circuit means.

3. The apparatus of claim 2 wherein said relatively low voltage control circuit means comprises light emitting diode means for emitting an optical pulse corresponding to said third control pulse and wherein said relatively high voltage power supply circuit means comprises optically responsive relay means coupled for controlling the conducting state of said electronic switching means in response to said optical pulse.

4. The apparatus of claim 1 wherein said first timing means comprises a flip flop having an output coupled to the lead wire bonding machine for delivering the first control pulse for controlling the extension of the shield and delivery of cover gas, wherein said second timing means comprises a first dual multivibrator having, said first dual multivibrator for receiving signals from the bonding machine to initiate controlled ball formation, said first dual multivibrator comprising first output means coupled to the flip flop to initiate extension of the shield and delivery of cover gas and second output means constructed and arranged for delivering the second control pulse, wherein said third and fourth timing means comprise a second dual multivibrator coupled to the second output means of the first dual multivibrator, said second dual multivibrator having first output means for generating the third control pulse sequentially following the second control pulse, said first output means of the second dual multivibrator being coupled through the coupling means to the relatively high voltage power supply circuit means, said second dual multivibrator having second output means also coupled to the flip flop and constructed and arranged for generating and delivering the fourth control pulse to said flip flop for retracting the shield and shutting off delivery of cover gas following the cooling delay defined by the duration of said fourth control pulse.

5. The apparatus of claim 1 wherein said lead wire comprises aluminum lead wire, wherein said voltage source comprises DC voltage in the range of 340 to 1,300 volts, wherein said resistance means comprises resistance in the range of 5 to 2,000 ohms.

6. The apparatus of claim 5 wherein the voltage source comprises DC voltage in the preferred range of 400 to 1,300 volts, wherein the resistance means comprises resistance in the preferred range of 5 to 200 ohms, said voltage and resistance selected so that the time window between the shortest duration and longest duration of arc discharge which result in optimal ball formation of a substantially spherical ball without necking is in the range of 0.05 to 0.1 mS.

7. The apparatus of claim 6 wherein the third timing means is constructed and arranged so that duration of the third control pulse is set in the time window between said shortest duration and longest duration of arc discharge to achieve a desired thickness of the lead wire neck adjacent to the ball.

8. The apparatus of claim 6 wherein the high voltage source comprises approximately 400 to 850 volts, wherein the resistance means comprises approximately 50 ohms, and wherein the duration of the third control pulse and arc discharge between the shield and lead wire is in the range from 0.65 to 0.70 mS whereby the width of the time window between the shortest duration and longest duration of arc discharge which result in optimal ball formation without necking is approximately 0.05 mS.

9. The apparatus of claim 1 wherein said lead wire comprises aluminum lead wire approximately 1.25 mil in diameter, wherein the high voltage source is approximately 400 to 850 volts DC, wherein the resistance means is approximately 50 ohms, the pulse duration of the third control pulse and therefore the arc discharge is in the range of approximately 0.65 to 0.70 mS, and wherein the time window between the shortest and longest durations of arc discharge which result in optimal ball formation without necking is in the range of approximately 0.05 to 0.1 mS.

10. A method for controlled bonding ball formation at the end of a lead wire held in the bonding tool of a lead wire bonding machine, by arc discharge between an extendable and retractable cover gas delivery shield of the bonding machine and the tail length of lead wire projecting beyond the bonding tool comprising:
   moving the shield to an extended position adjacent to the tail length of lead wire projecting beyond the bonding tool for delivering cover gas over the end of the lead wire;
   flooding the tail length of lead wire with cover gas during a first delay period thereby displacing oxygen from the shield and the end of the lead wire;
   electronically initiating arc discharge between the shield and tail length of lead wire after said first delay period while continuing to flood the end of the lead wire with cover gas, thereby melting the tail length of said lead wire to form the bonding ball;
   electronically controlling the duration of arc discharge within a time window between the shortest and longest durations of arc discharge which result in optimal ball formation of a substantially spherical ball at the end of the lead wire without necking of the lead wire above the formed ball;
   electronically terminating the arc discharge within said time window range for optimal ball formation of a substantially spherical ball without necking and continuing to flood the end of the lead wire with cover gas during a second delay period for cooling the bonding ball formed at the end of the lead wire;
   and retracting the shield following said second delay period, for ball bonding of the lead wire to the die pad of an integrated circuit chip.

11. The method of claim 10 wherein the steps of electronically initiating arc discharge, electronically controlling the duration of arc discharge, and electronically terminating arc discharge comprise:
   generating in a relatively low voltage first circuit a relatively low voltage timing pulse having a pulse width duration in the time window range between the shortest and longest durations of arc discharge which result in optimal ball formation of a substantially spherical ball without necking;
   applying a relatively high voltage source through resistance means in a relatively high voltage second circuit including said shield and lead wire for initiating arc discharge between the shield and tail length of lead wire in response to the leading edge of said relatively low voltage timing pulse; and
   switching off said relatively high voltage in the second circuit in response to the trailing edge of said relatively low voltage timing pulse.

12. The method of claim 11 further comprising generating an optical timing pulse in response to the relatively low voltage timing pulse, and optically coupling the relatively low voltage first circuit with the relatively high voltage second circuit.

13. The method of claim 11 comprising the step of applying a relatively high voltage source in the range of 400 to 1,300 volts through a resistance in the range of 5 to 2,000 ohms.

14. The method of claim 13 comprising the steps of applying a relatively high voltage source in the preferred range of 400 to 1,300 volts through a resistance in a preferred range of 5 to 200 ohms and selecting the voltage and resistance so that the time window between the shortest and longest durations of arc discharge which result in optimal ball formation without necking is in the range of 0.05 to. 0.1 mS.

15. The method of claim 14 wherein the lead wire comprises aluminum lead wire having a diameter of approximately 1.25 mil and wherein the duration of the relatively low voltage pulse is in the range of from approximately 0.65 to 0.70 mS.

16. The method of claim 14 further comprising the steps of:
adjusting the tail length of lead wire to provide a ball of desired size and mass;
selecting the high voltage source and resistance means in said preferred ranges according to the selected tail length at a level adequate to form the tail length into a substantially spherical ball;
empirically determining the longest and shortest duration of arc discharge which nevertheless results in optimal ball formation without necking and therefore determining the time window between said longest and shortest arc discharge;
and adjusting the duration of the low voltage timing pulse to fall within said time window to provide a lead wire neck adjacent to the ball with specified thickness.

17. The method of claim 16 wherein the lead wire comprises aluminum lead wire having a diameter in the range of approximately 1.25 mil and further comprising the steps of selecting the high voltage source in the range of approximately 400 to 850 volts DC, selecting the resistance means in the range of approximately 50 ohms, and adjusting the duration of the relatively low voltage pulse in the range of approximately 0.65 to 0.70 mS.

18. The method of claim 11 wherein said time window comprises the range of duration of arc discharges defined by the shorter time pulse end or boundary at which a substantially spherical ball is formed with a thickened or reinforced neck (FIG. 5C) and by the longer time pulse end or boundary at which a substantially spherical ball is formed with a straight neck (FIG. 5B).

19. The method of claim 18 comprising the step of adjusting the duration of arc discharge within said time window to provide a substantially spherical ball having a neck of specified thickness.

20. The method of claim 19 comprising the step of adjusting the duration of arc discharge within said time window to provide a substantially spherical ball having a thickened or reinforced neck.

21. The method of claim 11 further comprising:
selecting a lead wire tail length projecting beyond the bonding tool to provide a ball ot desired size and mass;
selecting a relatively high voltage source at a level adequate to form a substantially spherical ball from the tail length mass of metal;
and selecting the duration of arc discharge within said time window to provide a lead wire neck of desired thickness adjacent to the ball.

22. The method of claim 10 wherein the lead wire comprises aluminum lead wire having a diameter in the range of approximately 1.25 mil, and further comprising the steps of initiating arc discharge between the shield and lead wire in the voltage range of approximately 400 to 850 volts DC through a resistance in the range of approximately 50 ohms, and controlling the duration of arc discharge in the range of from approximately 0.65 to 0.70 mS whereby the time window between the shortest and longest durations of arc discharge which result in optimal ball formation without necking is in the range of approximately 0.05 to 0.1 mS.

23. A method for controlled bonding ball formation at the end of a lead wire held in the bonding tool of a lead wire bonding machine, by arc discharge between the extendable and retractable cover gas delivery shield of the bonding machine and the lead wire, said arc discharge thereby melting and forming a ball at the end of the lead wire for ball bonding to the die pad of an integrated circuit chip, comprising:
generating a first control pulse of first duration for controlling extension of the shield and delivery of cover gas through said shield throughout said first duration;
generating a second control pulse of second duration for introducing a cover gas movement delay before ball formation for displacing oxygen from the shield and the end of the lead wire;
generating a third control pulse of third duration sequentially following the second control pulse for initiating arc discharge between the shield and lead wire;
controlling the duration of the third control pulse for controlling the duration of said arc discharge within an empirically determined time window between the shortest and longest durations of arc discharge which result in optimal ball formation of a substantially spherical ball at the end of the lead wire without necking of the lead wire above the formed ball;
generating a fourth control pulse of fourth duration sequentially following the third control pulse for introducing a cooling delay for cooling a ball formed at the end of the lead wire with cover gas prior to ball bonding;
adjusting the durations of said respective control pulses so that the duration of the first control pulse is substantially the same as or greater than the composite durations of the sequential second, third, and fourth control pulses and substantially coincident in time with said sequential second, third, and fourth control pulses;
applying a high voltage through a resistance to the shield and lead wire in response to the third control pulse for arc discharge between the shield and lead wire for the duration of said third control pulse.

24. The method of claim 23 including the step of optically coupling the third control pulse and the high voltage.

* * * * *